United States Patent
Byun

(10) Patent No.: US 7,201,078 B2
(45) Date of Patent: Apr. 10, 2007

(54) TRANSPORTING APPARATUS

(75) Inventor: Kyung-seok Byun, Sungnam (KR)

(73) Assignee: Samsung Electronics Co., Ltd., Suwon-si (KR)

(*) Notice: Subject to any disclaimer, the term of this patent is extended or adjusted under 35 U.S.C. 154(b) by 415 days.

(21) Appl. No.: 10/663,859

(22) Filed: Sep. 17, 2003

(65) Prior Publication Data

US 2004/0154426 A1   Aug. 12, 2004

(30) Foreign Application Priority Data

Feb. 7, 2003   (KR) ...................... 10-2003-0007841

(51) Int. Cl.
   *B25J 17/00* (2006.01)
(52) U.S. Cl. ................. 74/490.03; 74/490.08
(58) Field of Classification Search ............ 74/490.03, 74/490.13, 490.01; 414/935, 940
   See application file for complete search history.

(56) References Cited

U.S. PATENT DOCUMENTS

| | | | |
|---|---|---|---|
| 4,666,366 A | | 5/1987 | Davis |
| 5,180,276 A | * | 1/1993 | Hendrickson ............ 414/752.1 |
| 5,227,708 A | | 7/1993 | Lowrance |
| 5,333,986 A | | 8/1994 | Mizukami et al. |
| 5,421,695 A | * | 6/1995 | Kimura ................... 414/744.5 |
| 5,447,409 A | | 9/1995 | Grunes et al. |
| 5,647,724 A | | 7/1997 | Davis, Jr. et al. |
| 5,775,169 A | * | 7/1998 | Solomon et al. ......... 74/490.01 |
| 5,813,824 A | | 9/1998 | Zanzig et al. |
| 5,857,826 A | * | 1/1999 | Sato et al. ............... 414/744.6 |
| 5,950,495 A | * | 9/1999 | Ogawa et al. ........... 74/490.01 |
| 6,057,662 A | * | 5/2000 | McAndrew et al. ........ 318/567 |
| 6,189,404 B1 | | 2/2001 | Hatake et al. |
| 6,299,404 B1 | * | 10/2001 | Muka et al. ............. 414/744.5 |

(Continued)

FOREIGN PATENT DOCUMENTS

JP   62-251091   10/1987

(Continued)

OTHER PUBLICATIONS

The First Office Action issued by the State Intellectual Property Office of People's Republic of China issued Jan. 6, 2006 in Application No. 03159858.7 including the Details of the First Office Action (13 pages).

(Continued)

*Primary Examiner*—Thomas R. Hannon
*Assistant Examiner*—Justin Krause
(74) *Attorney, Agent, or Firm*—Staas & Halsey LLP

(57) ABSTRACT

A transporting apparatus includes a supporting part, first and second driving axles rotatably supported by the supporting part, a plurality of driving links respectively combined to the first and second driving axles, a plurality of transporting links rotatably connected to the driving links, and a transporting table rotatably connected to the transporting links by pivots to reciprocate by a cooperation of the driving links and the transporting links. The first and second driving axles are aligned in a reciprocating direction of the transporting table. Thus, the present invention provides a transporting apparatus in which the first and second driving axles are aligned in a reciprocating direction of the transporting table, so that a moment load acting on the transporting table is decreased, preventing the transporting table from drooping and enhancing transport efficiency.

14 Claims, 10 Drawing Sheets

U.S. PATENT DOCUMENTS

| | | |
|---|---|---|
| 6,382,902 B1 | 5/2002 | Sugimura |
| RE37,731 E * | 6/2002 | Ogawa et al. ............ 74/490.01 |
| 2001/0004852 A1* | 6/2001 | Mitsuyoshi .............. 74/490.01 |
| 2002/0127091 A1 | 9/2002 | Lowrance et al. |

FOREIGN PATENT DOCUMENTS

| | | |
|---|---|---|
| JP | 7-108483 | 4/1995 |
| JP | 8-39463 | 2/1996 |
| JP | 10-202573 | 8/1998 |
| JP | 10-230492 | 9/1998 |
| JP | 11-119830 | 4/1999 |
| JP | 11-207666 | 8/1999 |
| KR | S62-251091 | 2/1999 |
| KR | 1999-72165 | 9/1999 |
| WO | 97/21525 | 6/1997 |

OTHER PUBLICATIONS

Japanese Office Action issued by the Japanese Patent Office in Application No. 2003-349923 dated Jul. 4, 2006 (4 pages).

* cited by examiner

TRANSPORTING APPARATUS

CROSS-REFERENCE TO RELATED APPLICATION

This application claims the benefit of Korean Patent Application No. 2003-7841, filed Feb. 7, 2003, in the Korean Intellectual Property Office, the disclosure of which is incorporated herein by reference.

BACKGROUND OF THE INVENTION

1. Field of the Invention

The present invention relates to a transporting apparatus, and more particularly, to a transporting apparatus in which two driving units having a plurality of links are interlocked to easily transport articles such as a semiconductor assembly.

2. Description of the Related Art

Generally, a semiconductor manufacturing system includes a transporting apparatus to automatically transmit a semiconductor assembly such as a wafer, a liquid crystal display LCD substrate, etc., in order to enhance work efficiency through an automated manufacturing line. A selective compliance assembly robot arm (SCARA) transporting apparatus has been mainly used. Recently, however a parallel transporting apparatus has been used because it has a simple structure as compared with that of the SCARA transporting apparatus and is useful in a vacuum condition.

The conventional parallel transporting apparatus has two driving units having a plurality of links interlocked in parallel so as to transport a semiconductor assembly. For example, there is disclosed a transporting apparatus in U.S. Pat. No. 6,189,404, titled"ROBOT FOR HANDLING", in which the driving units are interlocked at a concentric axis by links and rotate about a coaxial driving axle, thereby reciprocating a transporting table. There are various other transporting apparatuses disclosed in U.S. Pat. No. 5,180,276, titled "ARTICULATED ARA TRANSFER DEVICE", and in U.S. Pat. No. 5,647,724, titled "SUBSTRATE TRANSPORT APPARATUS WITH DUAL SUBSTRATE HOLDERS".

In the conventional transporting apparatuses, the transporting links are connected to rear opposite sides of an oblong transporting table. Accordingly, even a small load on the transporting table causes a large moment. Stress due to the large moment is concentrated on pivots placed in the rear opposite sides of the transporting table and connecting the transporting table with the transporting links, so that the load of a transportable semiconductor assembly is limited to be relatively light. To overcome the above problems, there is additionally needed an accessory such as a bearing, etc., to support a heavy semiconductor assembly.

Further, in the conventional transporting apparatuses, the driving axles to drive driving links are symmetrically provided from left to right or coaxially. Accordingly, in the case of a dual X-type transporting apparatus including two transporting tables, the structure of the driving axles is complicated or the driving links may have a four-tiered structure to avoid an interference with each other, allowing production cost of the transporting apparatus to increase.

SUMMARY OF THE INVENTION

Accordingly, it is an aspect of the present invention to provide a transporting apparatus in which a load onto a transporting table is uniformly distributed, and a structure of driving links is simplified.

Additional aspects and advantages of the invention will be set forth in part in the description which follows and, in part, will be obvious from the description, or may be learned by practice of the invention.

The foregoing and/or other aspects of the present invention are achieved by providing a transporting apparatus including a supporting part, first and second driving axles rotatably supported by the supporting part, a plurality of driving links respectively combined to the first and second driving axles, a plurality of transporting links rotatably connected to the driving links, and a transporting table rotatably connected to the transporting links by pivots to reciprocate by a cooperation of the driving links and the transporting links. The first and second driving axles are aligned in a reciprocating direction of the transporting table.

According to an aspect of the invention, the first driving axle is passed through a center of the supporting part, and the second driving axle is eccentrically passed through the supporting part behind the first driving axle in the reciprocating direction of the transporting table.

According to an aspect of the invention, the pivots connecting the transporting links with the transporting table are aligned in the reciprocating direction of the transporting table.

According to an aspect of the invention, the transporting apparatus further includes an engaging device to interlock the first driving axle with the second driving axle, so that the first and second driving axles are rotated reversely to each other.

According to an aspect of the invention, the driving links are provided with groove parts to avoid an interference with the first and second driving axles.

According to an aspect of the invention, outside ends of the driving links combined to the first and second driving axles at inside ends thereof, are connected with two pairs of transporting links, and the two pairs of transporting links are connected to two transporting tables, respectively.

According to an aspect of the invention, the driving links have a three-tiered structure, so that two transporting tables are different in height and are alternately reciprocated.

According to an aspect of the invention, the driving links include first and third driving links symmetrically combined to the first driving axle, and second and fourth driving links combined to the second driving axle, being placed up and down relative to the first and third driving links, respectively, to avoid an interference with each other.

BRIEF DESCRIPTION OF THE DRAWINGS

The above and/or other aspects and advantages of the present invention will become apparent and more readily appreciated from the following description of the embodiments, taken in conjunction with the accompany drawings of which.

DETAILED DESCRIPTION OF THE PREFERRED EMBODIMENTS

Figure 1:
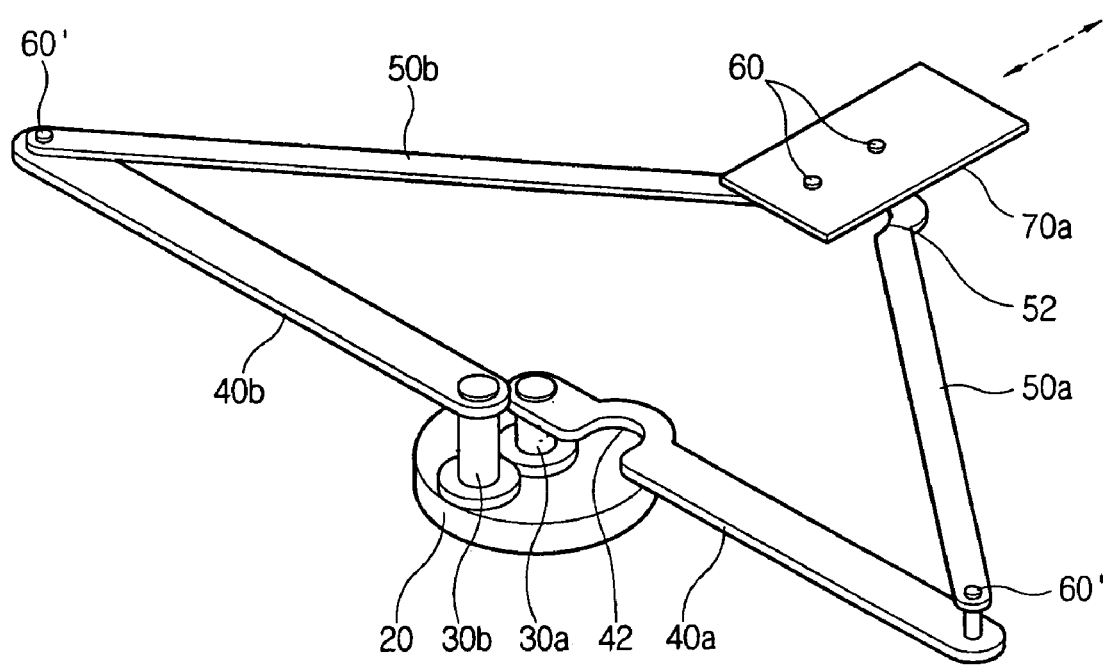
FIG. 1 is a perspective view of a transporting apparatus, according to an embodiment of the present invention.
Figure 2:
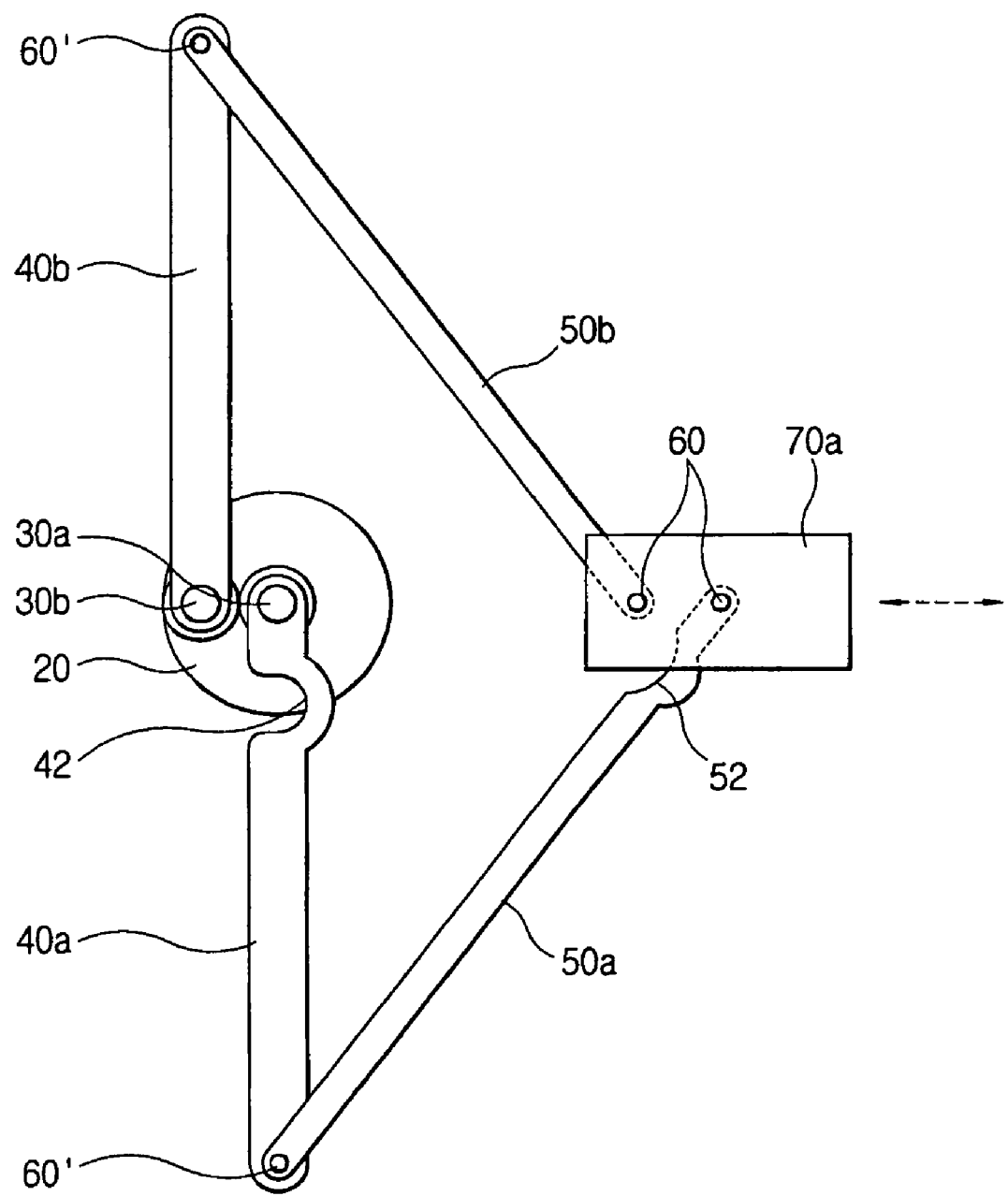
FIG. 2 is a plan view of the transporting apparatus of FIG. 1.

Reference will now be made in detail to the embodiments of the present invention, examples of which are illustrated in the accompanying drawings, wherein like reference numerals refer to like elements throughout. The embodiments are described below in order to explain the present invention by referring to the figures.

As shown in FIGS. 1, 2, and 3A through 3C, a transporting apparatus 10, according to an embodiment of the present invention, includes a supporting part 20, first and second driving axles 30a and 30b rotatably supported by the supporting part 20, and first and second driving links 40a and 40b respectively combined to the first and second driving axles 30a and 30b. The transporting apparatus 10 also includes first and second transporting links 50a and 50b rotatably connected to the first and second driving links 40a and 40b, and a transporting table 70a rotatably connected to the first and second transporting links 50a and 50b by pivots 60 to reciprocate by a cooperation of the first and second driving links 40a and 40b and the first and second transporting links 50a and 50b.

The first and second driving axles 30a and 30b are aligned in a reciprocating direction of the transporting table 70a, so that a moment loaded on the first and second driving axles 30a and 30b is decreased as compared with the conventional driving axles which are provided transversely to the reciprocating direction or provided coaxially. The reciprocating direction is designated by an arrow in FIGS. 1, 2, 3A, 3B, 3C, 6 and 7. Here, the first and second driving axles 30a and 30b are different in height to prevent the first and second driving links 40a and 40b connected thereto from interfering with each other.

Preferably, the first driving axle 30a is passed through a center of the supporting part 20, and the second driving axle 30b is eccentrically passed through the supporting part 20 behind the first driving axle 30a in the reciprocating direction of the transporting table 70a. However, the placement of the first and second driving axles 30a and 30b may vary as necessary.

The pivots 60 connecting the first and second transporting links 50a and 50b with the transporting table 70a are aligned in the reciprocating direction of the transporting table 70a, i.e., in a lengthwise direction of the transporting table 70a, like the first and second driving axles 30a and 30b.

Various known devices may be used in lieu of the pivots 60. Further, the pivots 60 may be provided to make the first and second driving links 50a and 50b rotate in opposite directions.

The first and second driving links 40a and 40b are symmetrically rotated according to a rotation of the first and second driving axles 30a and 30b, respectively. The first driving link 40a is provided with a groove part 42 to avoid an interference with the second driving axle 30b when the first and second driving links 40a and 40b are backward aligned in the reciprocating direction. Similarly, the first transporting link 50a is provided with a groove part 52.

Further, pivots 60' connect the first and second driving links 40a and 40b with the first and second transporting links 50a and 50b, respectively.

Figure 3A:
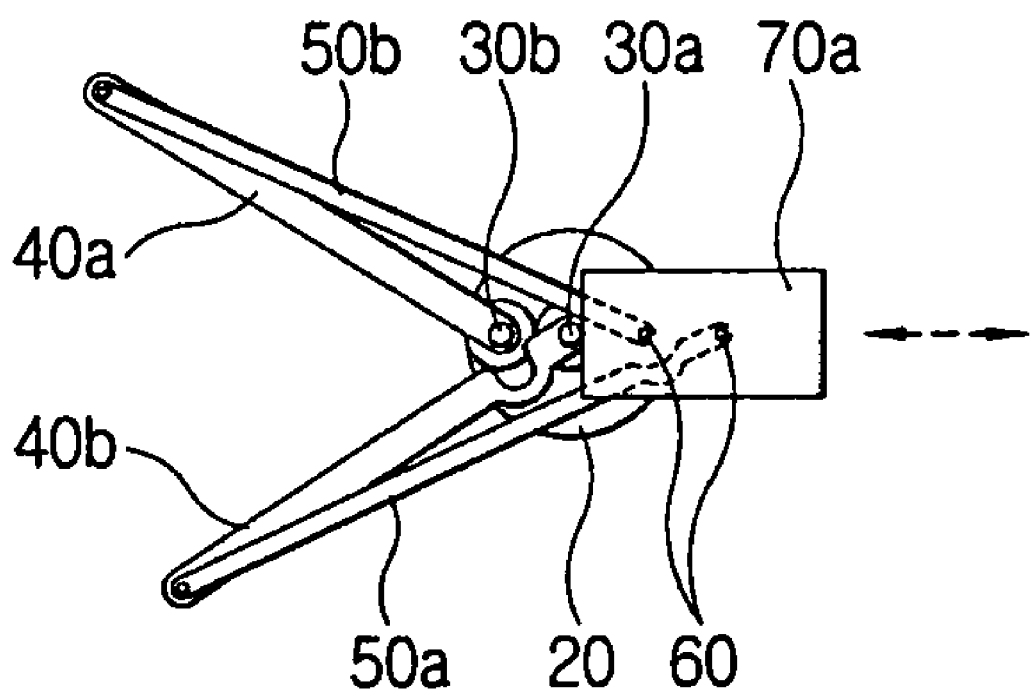
FIGS. 3A through 3C are operation views of the transporting apparatus of FIG. 1.
Figure 3B:
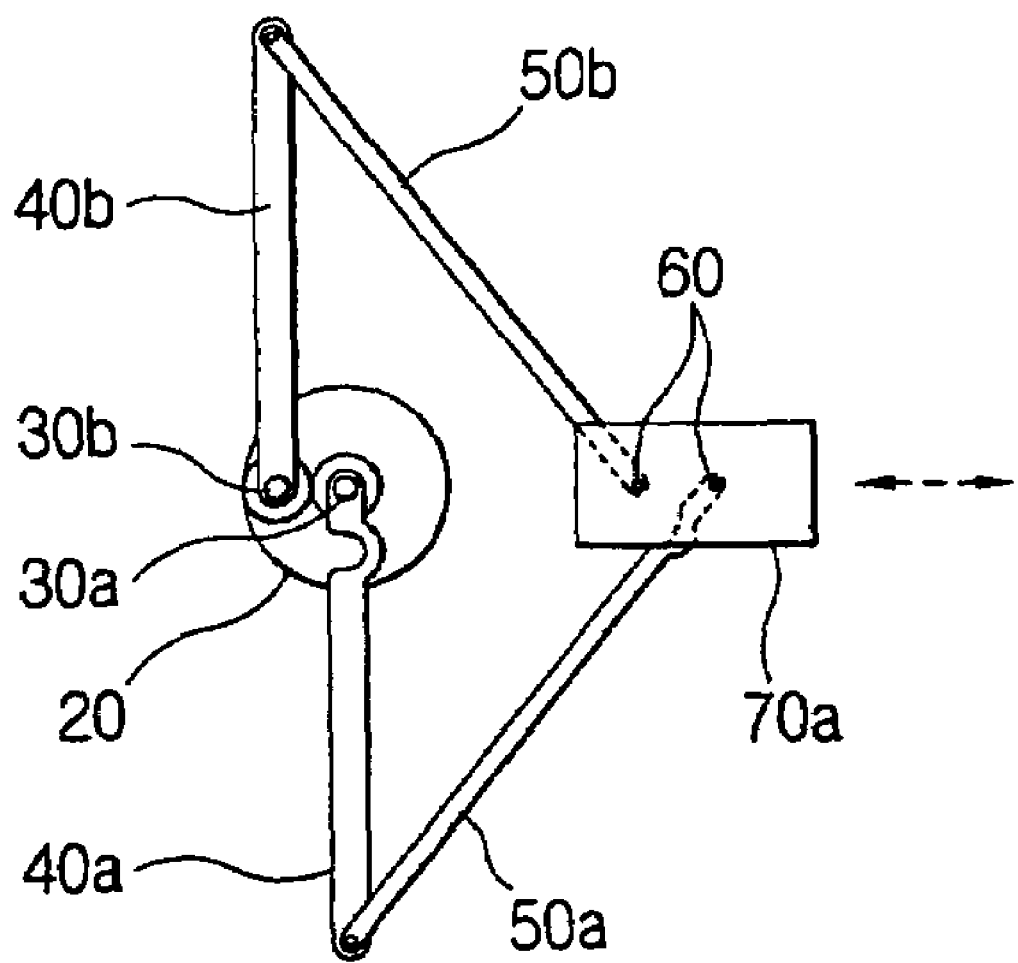
Figure 3C:
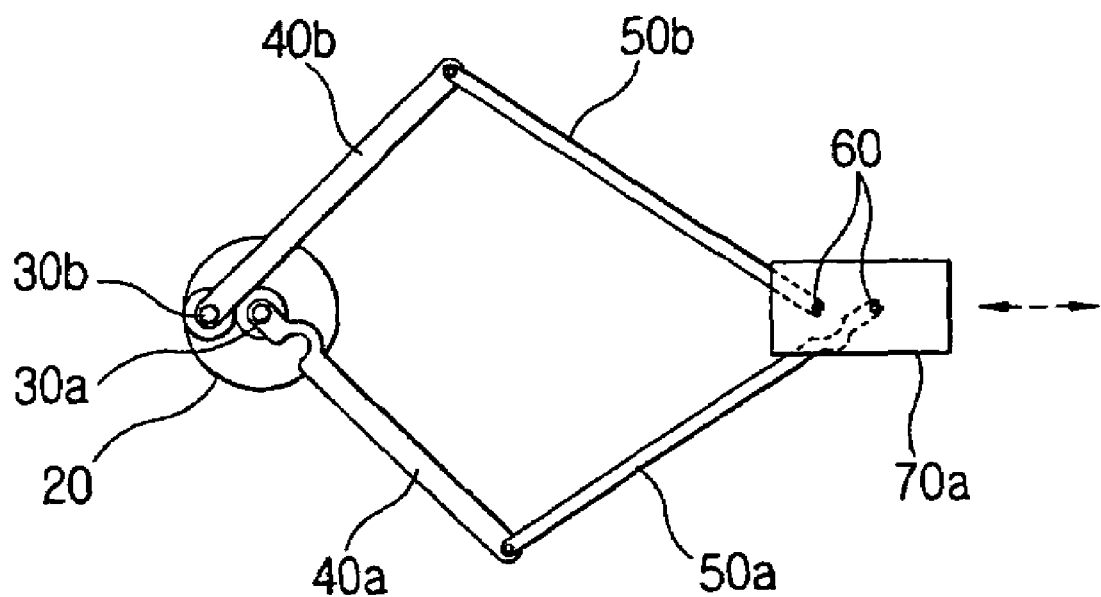

As shown in FIGS. 3A through 3C, an operation of the transporting apparatus 10 according to the above embodiment is described below.

A driving part (see FIG. 8) drives the first and second driving axles 30a and 30b to rotate, and therefore the first and second driving links 40a and 40b respectively combined to the first and second driving axles 30a and 30b are rotated. Then, the first and second transporting links 50a and 50b respectively interlocked with the first and second driving links 40a and 40b are rotated, thereby reciprocating the transporting table 70a forward and backward.

Figure 4:
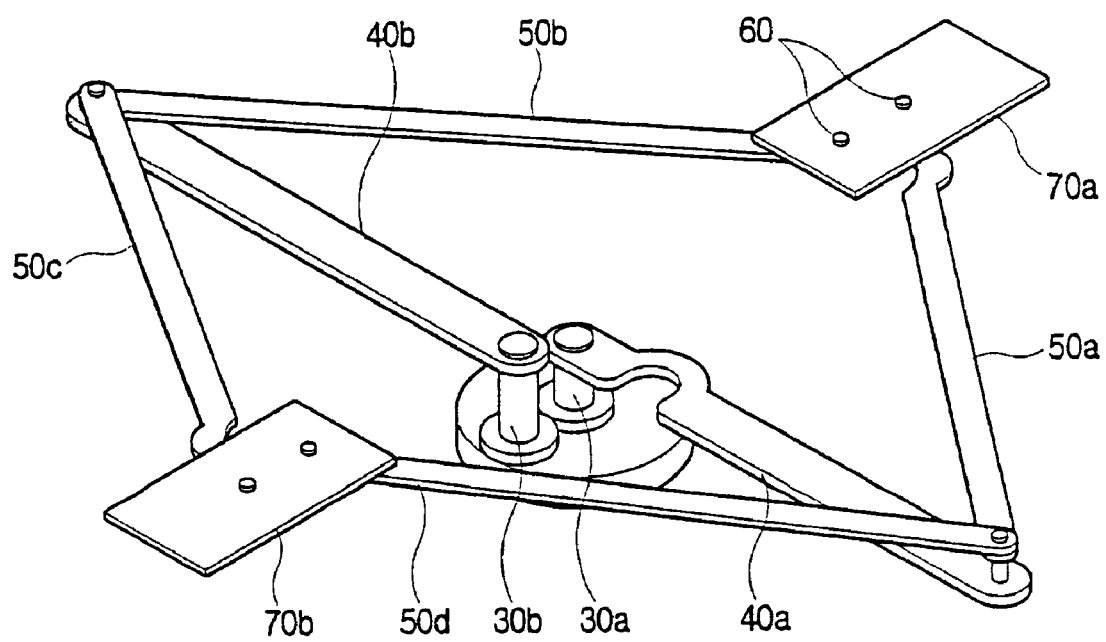
FIG. 4 is a perspective view of a transporting apparatus according, to another embodiment of the present invention.
Figure 5:
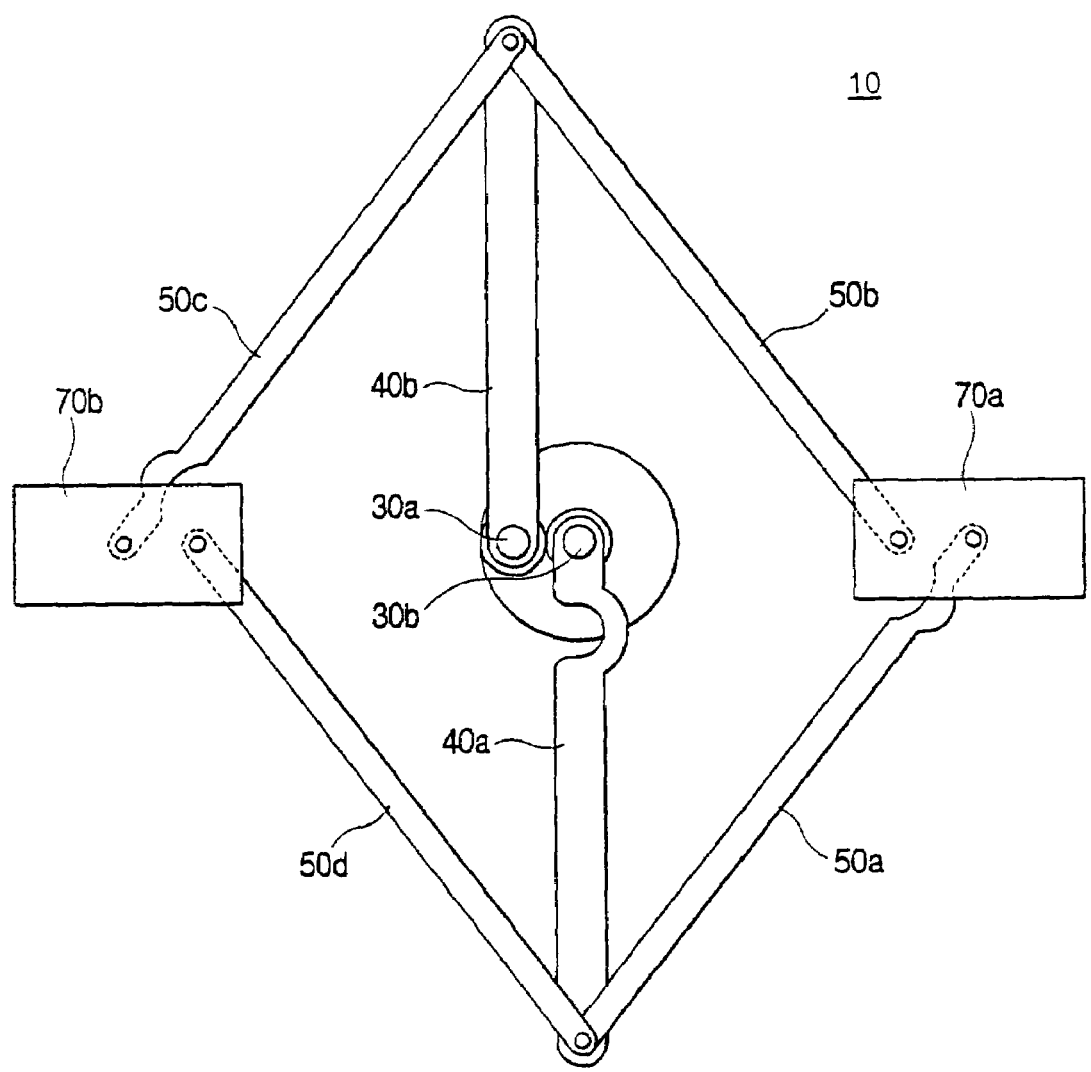
FIG. 5 is a plan view of the transporting apparatus of FIG. 4.

FIGS. 4 and 5 are perspective and plan views of a transporting apparatus 10, according to another embodiment of the present invention, respectively.

As shown in FIGS. 4 and 5, the transporting apparatus 10 includes third and fourth transporting links 50c and 50d, and a second transporting table 70b in addition to the above described embodiment. Thus, the third and fourth transporting links 50c and 50d and the second transporting table 70b are placed oppositely to the first and second transporting links 50a and 50b and the first transporting table 70a.

Outside ends of the first and second driving links 40a and 40b combined to the first and second driving axles 30a and 30b at inside ends thereof are connected with two pairs of the transporting links 50a and 50b, 50c and 50d. The two pairs of the transporting links 50a and 50b, 50c and 50d are connected to the first and second transporting tables 70a and 70b, respectively.

Thus, the transporting apparatus 10 in this embodiment may have the same degree of freedom as in the above described embodiment, but enhances transport efficiency because the first and second transporting tables 70a and 70b alternately transport.

Figure 6:
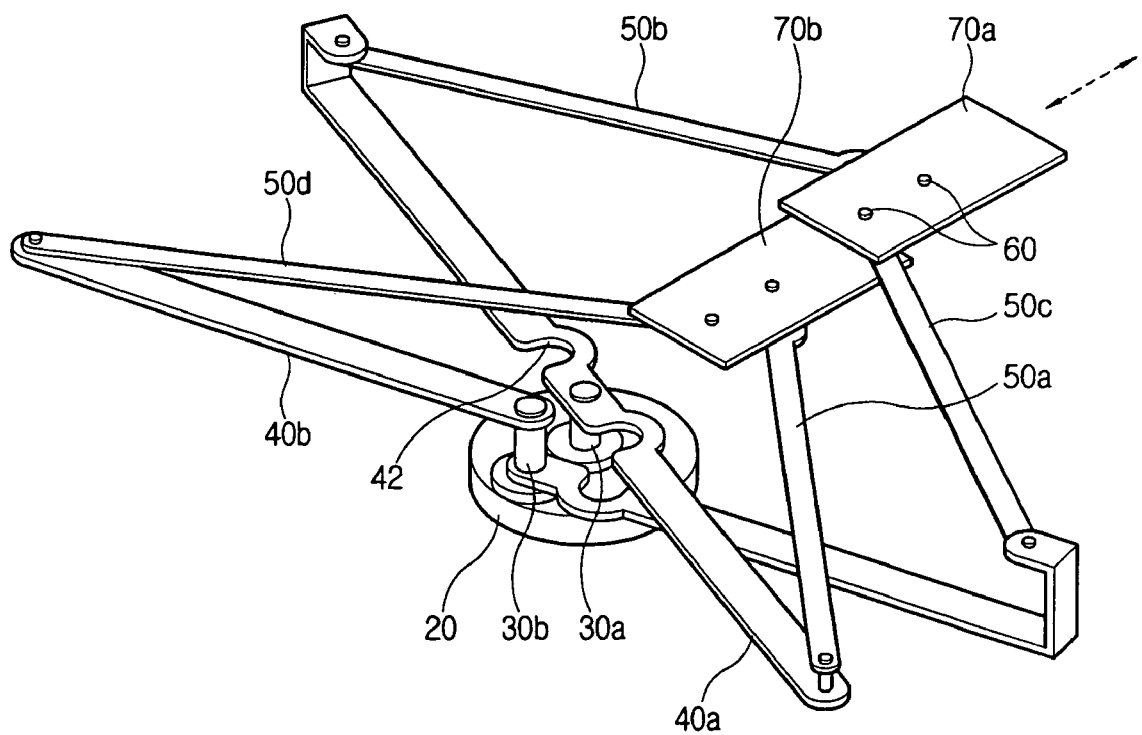
FIG. 6 is a perspective view of a transporting apparatus, according to another embodiment of the present invention.
Figure 7:
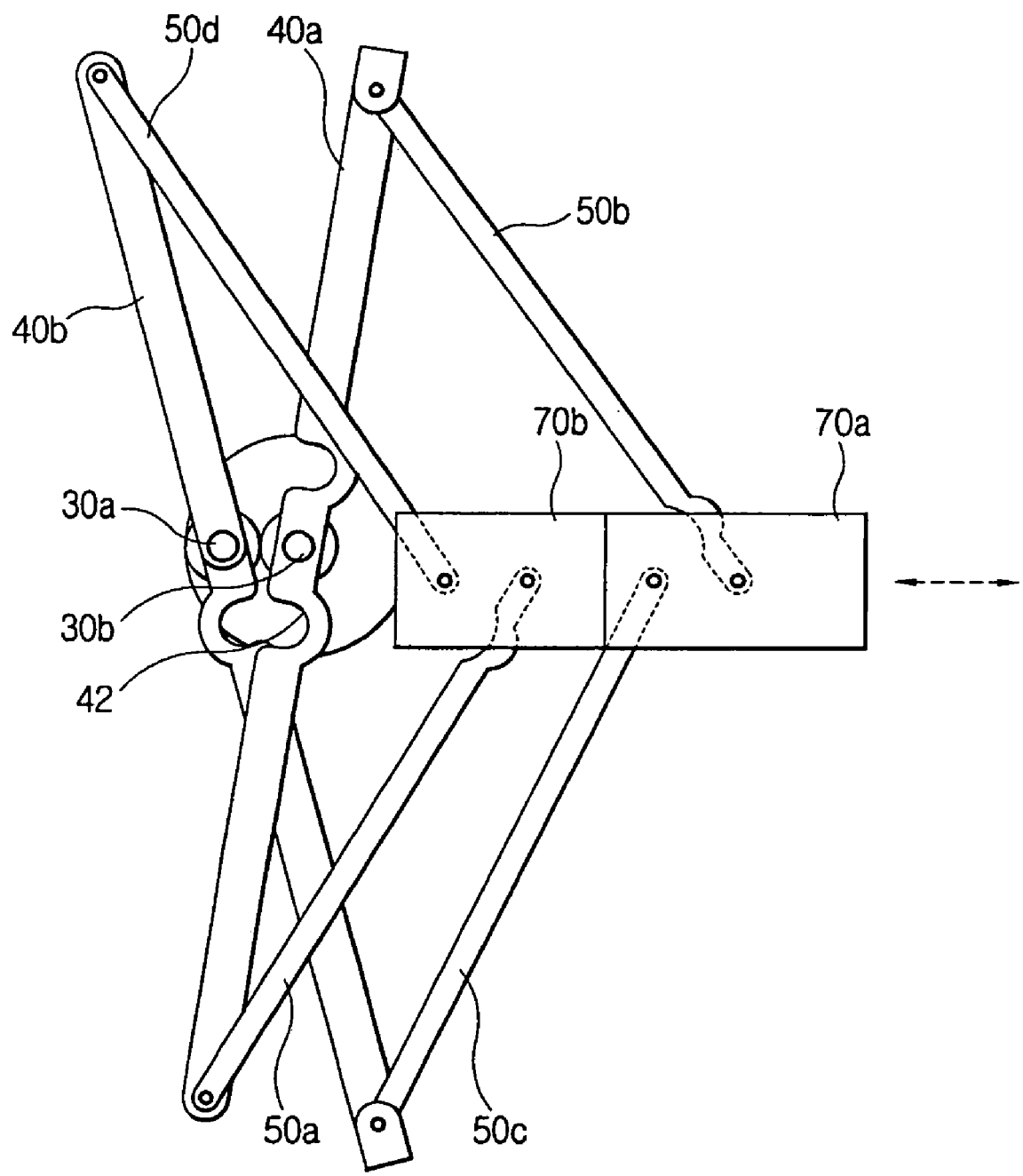
FIG. 7 is a plan view of the transporting apparatus of FIG. 6.

FIGS. 6 and 7 are perspective and plan views of a transporting apparatus 10 according to yet another embodiment of the present invention, respectively.

As shown in FIGS. 6 and 7, first and second transporting tables 70a and 70b are placed in the same side. Here, a plurality of the pivots 60 respectively connecting the first, second, third and fourth transporting links 50a, 50b, 50c and 50d with the first and second transporting tables 70a and 70b are aligned in the reciprocating direction of the first and second transporting tables 70a and 70b. Further, the first and second, and third and fourth driving links 40a, 40b, 40c and 40d have a three-tiered structure, so that the first and second transporting tables 70a and 70b are different in height and may be alternately reciprocated in the same side.

The first and third driving links 40a and 40c are provided as a single body and symmetrically combined to a first driving axle 30a. The second and fourth driving links 40b and 40d are combined to a second driving axle 30b and placed up and down relative to the first and third driving links 40a and 40c, respectively, to thereby avoid an interference with each other.

The first, second, third and fourth driving links 40a, 40b, 40c and 40d are rotatably connected with the first, fourth, second and third transporting links 50a, 50d, 50b and 50c, respectively. The two pairs of the transporting links 50b and 50c, 50a and 50d are rotatably connected to the first and second transporting tables 70a and 70b, respectively. Here, the first and second transporting tables 70a and 70b are different in height to avoid an interference with each other while alternately reciprocating. Further, the first, third and fourth driving links 40a, 40c and 40d are provided with the groove parts 42 to avoid an interference with the first and second driving axles 30a and 30b when the first, third and fourth driving links 40a, 40c and 40d are aligned in the reciprocating direction.

Thus, the first, second, third and fourth driving links 40a, 40b, 40c and 40d may have the three-tiered structure because the first and second driving axles 30a and 30b are not coaxially provided, thereby simplifying the transporting apparatus 10 by having a slim structure.

Operation of the transporting apparatus 10 according to the above-described embodiments, are described below.

A driving part (see FIG. 8) drives the first and second driving axles 30a and 30b rotatably supported by the supporting part 20 to rotate. Therefore, the first, second, third and fourth driving links 40a, 40b, 40c and 40d and the first, second, third and fourth transporting links 50a, 50b, 50c and 50d are relatively operated, so that the first and second transporting tables 70a and 70b are alternately reciprocated. Thus, the transporting apparatus 10 according to the above-described embodiments has the same degree of freedom as in the first described embodiment, but enhances transport efficiency because the first and second transporting tables 70a and 70b alternately transport.

Figure 8:
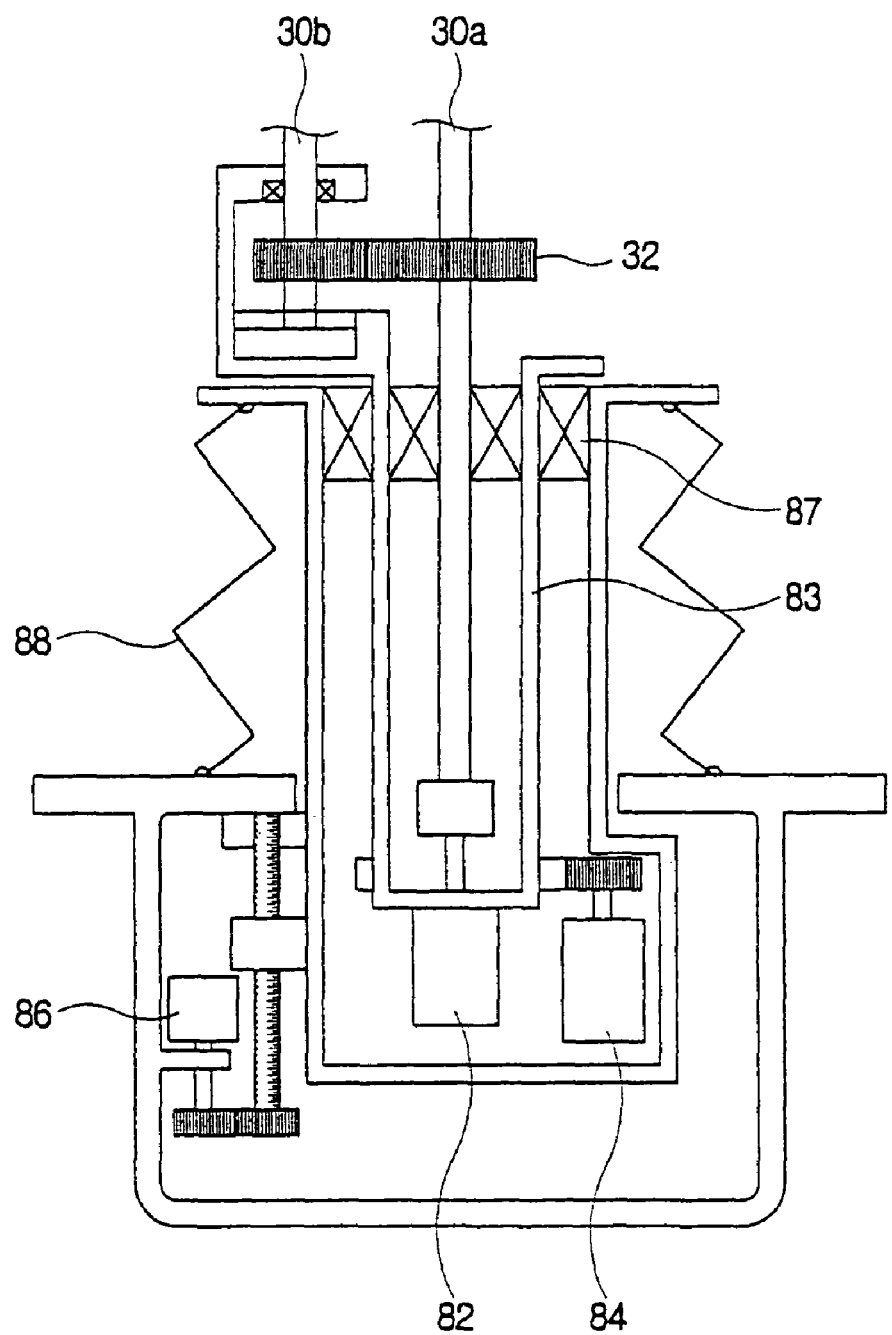
FIG. 8 is a schematic view of a driving part of the transporting apparatus according to the present invention.

FIG. 8 is a schematic view of the driving part of the transporting apparatus 10 according to the present invention.

As shown in FIG. 8, the driving part includes a first motor 82 to drive the first or second driving axle 30a or 30b to rotate, and a second motor 84 to drive a supporting shaft 83 of the supporting part 20 interlocked with the first and second driving axles 30a and 30b to rotate. The driving part also includes a third motor 86 to drive the supporting shaft 83 and the second motor 84 to move up and down.

The first and second driving axles 30a and 30b are provided with an engaging device 32, so that the second driving axle 30b rotates reversely to the first driving axle 30a when the first motor 82 drives the first driving axle 30a to rotate. Here, the engaging device 32 may include a gear.

It is preferable that one of the first and second driving axles 30a and 30b is indirectly driven by the first motor 82.

Further, it is preferable that the supporting shaft 83 and one of the first and second driving axles 30a and 30b is concentrically provided.

Further, the driving part includes a feedthrough 87 and a bellows 88 which are generally employed to make the driving part vacuous, and may be driven by various methods as necessary.

As described above, the present invention provides a transporting apparatus in which first and second driving axles are aligned in a reciprocating direction of a transporting table, so that a moment load acting on the transporting table is decreased, thereby preventing the transporting table from drooping and enhancing transport efficiency.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A transporting apparatus, comprising:
   a supporting part;
   first and second driving axles rotatably supported by the supporting part;
   a plurality of driving links respectively combined to the first and second driving axles;
   a plurality of transporting links rotatably connected to the driving links;
   a transporting table rotatably connected to the transporting links by pivots to reciprocate by a cooperation of the driving links and the transporting links, the first and second driving axles being aligned in a reciprocating direction of the transporting table; and
   a driving part to drive the first and second driving axles, the driving part including,
      a first motor, wherein the first motor drives the first and second driving axles to rotate;
      a second motor, wherein the second motor drives and rotates a supporting shaft of the supporting part which is interlocked with the first and second driving axles; and
      a third motor, wherein the supporting shaft and the second motor are driven to move up and down by the third motor,
   wherein the first driving axle is passed through a center of the supporting part, and the second driving axle is eccentrically passed through the supporting part along an axis formed by the first driving axle and the reciprocating direction of the transporting table.

2. The transporting apparatus according to claim 1, wherein the pivots connecting the transporting links with the transporting table are aligned in the reciprocating direction of the transporting table.

3. The transporting apparatus according to claim 1, further comprising:
   an engaging device to interlock the first driving axle with the second driving axle, so that the first and second driving axles are rotated reversely to each other.

4. The transporting apparatus according to claim 1, further comprising:
   an engaging device to interlock the first driving axle with the second driving axle, so that the first and second driving axles are rotated reversely to each other.

5. The transporting apparatus according to claim 1, wherein the driving links are provided with groove parts to avoid an interference with the first and second driving axles.

6. The transporting apparatus according to claim 1, wherein outside ends of the driving links combined to the first and second driving axles at inside ends thereof, are connected with two pairs of transporting links, and the two pairs of transporting links are connected to two transporting tables, respectively.

7. The transporting apparatus according to claim 1, wherein the links are connected to the first and second driving axles, and the first and second driving axles are different in height to prevent the links connected thereto from interfering with each other.

8. The transporting apparatus according to claim 1, wherein the pivots allow the first and second driving axles to rotate in opposite directions.

9. The transporting apparatus according to claim 1, wherein the driving links are symmetrically rotated according to a rotation of the first and second driving axles.

10. The transporting apparatus according to claim 1, wherein one of the first and second driving axles is indirectly driven by the first motor.

11. The transporting apparatus according to claim 1, wherein the supporting shaft and one of the first and second driving axles are provided concentrically.

12. The transporting apparatus according to claim 1, wherein the driving part comprises: a feedthrough and a bellows to make the driving part vacuous.

13. The transporting apparatus according to claim 1, wherein the driving links have a three-tiered structure, so that two transporting tables are different in height and alternately reciprocated.

14. The transporting apparatus according to claim 13, wherein the driving links comprise:
  first and third driving links symmetrically combined to the first driving axle; and
  second and fourth driving links combined to the second driving axle, being placed up and down relative to the first and third driving links, respectively, to avoid an interference with each other.

* * * * *